(12) United States Patent
Kutsuno et al.

(10) Patent No.: US 6,351,228 B1
(45) Date of Patent: Feb. 26, 2002

(54) DIGITAL CALIBRATION METHOD AND APPARATUS FOR A/D OR D/A CONVERTERS

(75) Inventors: Takao Kutsuno, Mitaka; Atsuhiko Ishida, Saitama; Seiken Udou, Honjo; Tsuneo Yamaba, Odawara; Hiroshi Ikeda, Kanagawa, all of (JP)

(73) Assignee: Hitachi Electronics Engineering Co., Ltd. (JP)

( * ) Notice: Subject to any disclaimer, the term of this patent is extended or adjusted under 35 U.S.C. 154(b) by 0 days.

(21) Appl. No.: 09/494,001

(22) Filed: Jan. 28, 2000

(30) Foreign Application Priority Data

Feb. 3, 1999 (JP) ............................................. 11-026282

(51) Int. Cl.$^7$ ................................................ H03M 1/10
(52) U.S. Cl. ......................... 341/120; 341/155; 341/144
(58) Field of Search ................................. 341/120, 110, 341/126, 118, 119, 121

(56) References Cited

U.S. PATENT DOCUMENTS

| | | | | |
|---|---|---|---|---|
| 3,685,048 A | * | 8/1972 | Pincus ........................ | 341/120 |
| 4,222,107 A | * | 9/1980 | Mrozowski et al. ........ | 341/120 |
| 4,371,868 A | * | 2/1983 | Van de Grift et al. ...... | 341/120 |
| 4,829,236 A | * | 5/1989 | Brenardi et al. ............ | 341/120 |
| 4,943,807 A | * | 7/1990 | Early et al. ................. | 341/120 |
| 5,294,926 A | * | 3/1994 | Corcoran ..................... | 341/120 |
| 5,331,321 A | * | 7/1994 | Mannonen ................... | 341/120 |
| 5,465,092 A | * | 11/1995 | Mayes et al. ............... | 341/118 |
| 5,598,157 A | * | 1/1997 | Kornblum et al. .......... | 341/120 |
| 5,706,003 A | * | 1/1998 | Kurkoski ..................... | 341/118 |
| 5,838,598 A | * | 11/1998 | Hurrell ........................ | 341/120 |
| 6,081,215 A | * | 6/2000 | Kost et al. .................. | 341/120 |
| 6,111,529 A | * | 8/2000 | Maulik et al. .............. | 341/120 |
| 6,140,948 A | * | 10/2000 | Yu .............................. | 341/120 |

* cited by examiner

Primary Examiner—Howard L. Williams
Assistant Examiner—Jean Bruner JeanGlaude
(74) Attorney, Agent, or Firm—Morrison & Foerster LLP

(57) ABSTRACT

Digital calibration of an A/D converter, which converts an analog signal into a digital signal, is performed by first sequentially inputting two analog signals of different values to the A/D converter, then calculating an offset calibration value and gain calibration coefficient on the basis of two digital converted signals generated from the A/D converter and then calibrating a digital signal output from the A/D converter on the basis of the thus-calculated offset calibration value and gain calibration coefficient. Digital calibration of a D/A converter, which converts a digital signal into an analog signal, is performed by first sequentially inputting two digital signals of different values to the D/A converter, then calculating an offset calibration value and gain calibration coefficient on the basis of two analog converted signals generated from the D/A converter and then calibrating a digital signal input to the D/A converter on the basis of the thus-calculated offset calibration value and gain calibration coefficient.

11 Claims, 4 Drawing Sheets

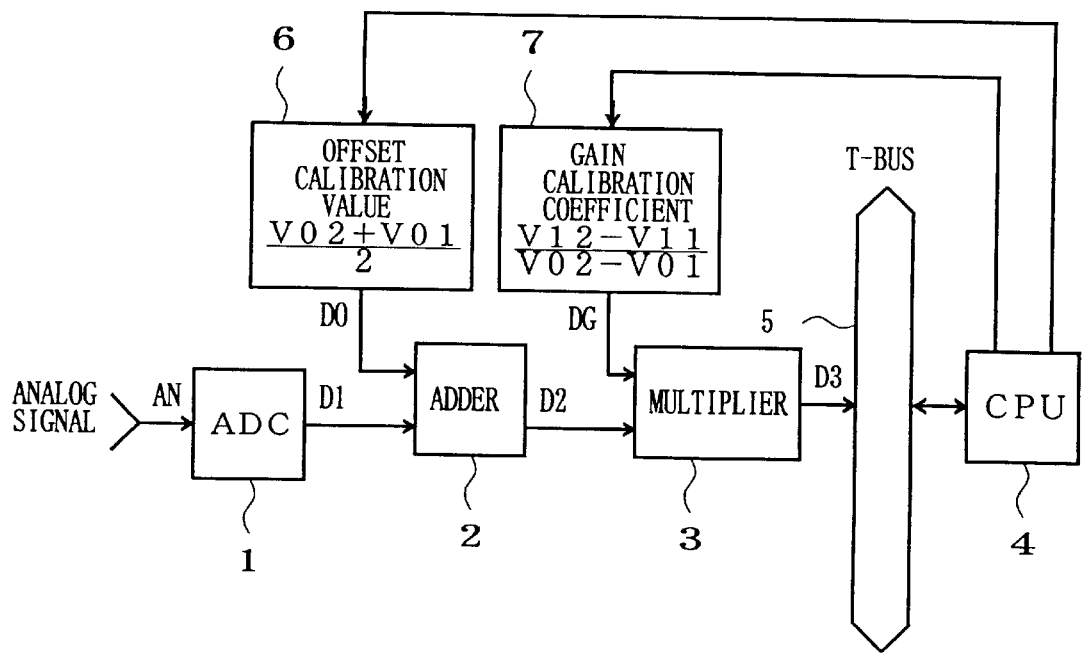
F I G. 1
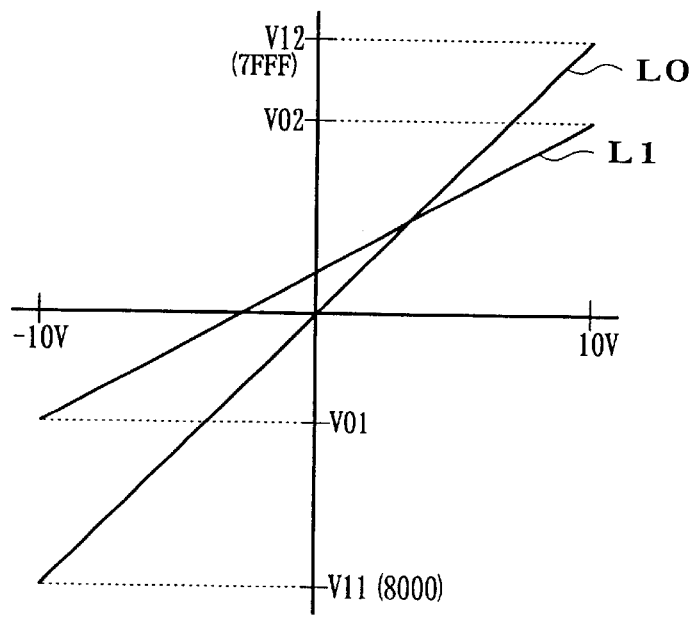
F I G. 2

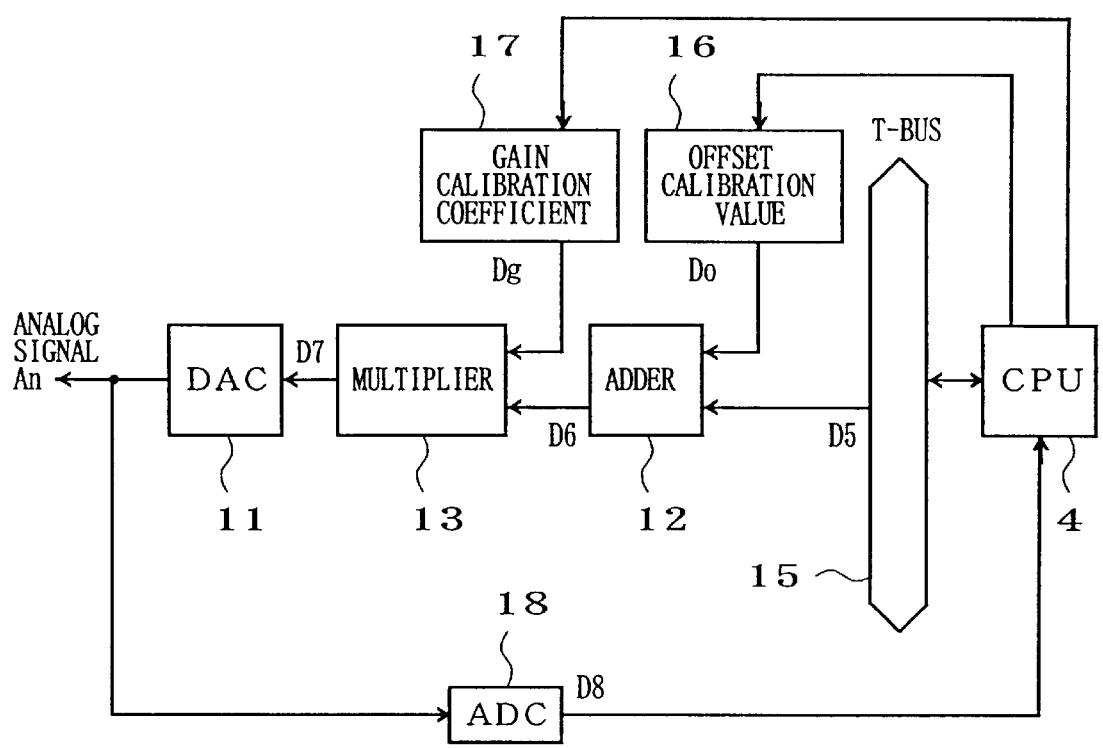
F I G. 4

DIGITAL CALIBRATION METHOD AND APPARATUS FOR A/D OR D/A CONVERTERS

TITLE OF THE INVENTION

Digital Calibration Method and Apparatus for A/D or D/A Converters

BACKGROUND OF THE INVENTION

The present invention relates generally to calibration methods and apparatus for calibrating A/D (Analog-to-Digital) or D/A (Digital-to-Analog) converters, and more particularly to an improved calibration method and apparatus for performing digital calibration on A/D and D/A converters employed in IC testers which test various electrical characteristics of IC (Integrated Circuit) devices.

In order to ship factory-fabricated IC devices as final products with performance and quality assurances, it is generally necessary to extract some or all of the IC devices and examine predetermined electrical characteristics of the extracted IC devices at manufacturing and testing stages in the factory. Normally, the electrical characteristics of the IC devices are examined by the so-called IC testers. Typically, the IC tester first sends predetermined test pattern data to each of the IC devices to be tested (hereinafter "to-be-tested IC device") and then reads output data produced from the IC device in response to the test pattern data sent thereto, on the basis of which the tester examines the IC device's electrical characteristics and determines whether or not the to-be-tested IC device has any trouble with its essential behavior and functions.

The tests performed by the IC testers can be roughly classified into a direct current test (i.e., DC measurement test) and a function test. In the direct current test, each to-be-tested IC device is checked for presence of trouble with its essential behavior by a DC measurement section applying a predetermined voltage or current to input/output terminals of the IC device. In the function test, on the other hand, predetermined test pattern data is fed from a pattern generation section to the input terminal of the to-be-tested IC device and output data produced from the IC device in response to the test pattern data is analyzed to determine whether the to-be-tested IC device has any trouble with its essential behavior and functions. More specifically, the function test supplies the to-be-tested IC device with various input signals, such as an address, data, write-enable signal and chip-select signal, while variously changing input conditions of the signals and then inspects timing, amplitudes, etc. with which the IC device generates output signals in response to the input signals. Because many A/D and D/A converters are generally employed in each of such IC testers, accurate adjustment or calibration (including gain calibration and offset calibration) of these A/D and D/A converters is extremely essential for high-accuracy tests of the factory-fabricated IC devices.

So far, the adjustment or calibration of the AD and D/A converters has been performed either in a manual manner based on manipulation of a trimmer resistor by a human operator or in an analog manner using an auxiliary D/A converter and digital potentiometer.

However, the above-mentioned manual calibration scheme using the trimmer resistor is disadvantageous in that it would take considerable amounts of time and human labor and thus can not be used suitably for the IC testers requiring calibration of many A/D and D/A converters. The analog calibration scheme, on the other hand, often proves very efficient because it can be performed automatically without any human labor. But, the accuracy of the analog calibration tends to deteriorate due to the nature of analog components or elements used. Further, because the analog calibration scheme calculates calibration coefficients through the "binary search" or "least square" method, it would take an extra amount of time for the calculation of the calibration coefficent.

SUMMARY OF THE INVENTION

It is therefore an object of the present invention to provide a digital calibration method and apparatus which can perform calibration of A/D and/or D/A converters in a digital manner. More specifically, the object of the present invention is to provide a digital calibration method and apparatus which can perform digital calibration of a great number of A/D and/or D/A converters at increased efficiency.

To accomplish the above-mentioned object, the present invention provides a digital calibration method for an analog-to-digital converter, which comprises the steps of: inputting at least two different reference analog signals to an analog-to-digital converter to be adjusted or calibrated; calculating calibration parameters on the basis of digital converted signals outputted by the analog-to-digital converter in response to input of the corresponding reference analog signals thereto; and performing calibrating arithmetic operations on an output digital signal from the analog-to-digital converter using the calibration parameters calculated by the calculating step. In the present invention, the above-mentioned calibration parameters may include an offset calibration value and gain calibration coefficient.

According to the present invention, predetermined calibration parameters, such as an offset calibration value and gain calibration coefficient, are calculated on the basis of digital converted signals outputted by the analog-to-digital converter in response to input of the corresponding reference analog signals, and then an output digital signal from the analog-to-digital converter is digitally adjusted or calibrated on the basis of the thus-calculated calibration parameters. With such arrangements, the present invention can eliminate a need for analog components or elements and thus can avoid unwanted influences, such as measurement errors, that would be caused by such analog elements. Further, because the offset calibration value and gain calibration coefficient are determined on the basis of the digital converted signals corresponding to the two reference signals, the calibration can be performed with increased accuracy at increased speed as compared to the conventional binary search or least square method. Therefore, the present invention can significantly reduce the necessary calibrating time even in a case where the calibration is performed on a great number of A/D converters employed in an IC tester or the like.

The present invention also provides a digital calibration method for a digital-to-analog converter, which comprises the steps of: inputting at least two different reference digital signals to a digital-to-analog converter to be calibrated; calculating calibration parameters on the basis of analog converted signals outputted by the digital-to-analog converter in response to input of the corresponding reference digital signals thereto; and performing calibrating arithmetic operations on the basis of an input digital signal to the digital-to-analog converter using the calibration parameters calculated by the calculating step. The above-mentioned calibration parameters may include an offset calibration value and gain calibration coefficient. Further, the aforementioned step of calculating may include a step of converting, into a digital signal, each of the analog converted signals outputted by the digital-to-analog converter in response to input of the corresponding reference digital signal and a step of calculating the calibration parameters on the basis of each of the digital signals provided by the step of converting.

According to this method, predetermined calibration parameters, such as an offset calibration value and gain calibration coefficient, are calculated on the basis of analog converted signals outputted by the digital-to-analog converter in response to input of the corresponding reference digital signals, and then an input digital signal to the digital-to-analog converter is digitally adjusted or calibrated on the basis of the thus-calculated calibration parameters. With such arrangements, the inventive method can eliminate a need for analog elements and thus can avoid unwanted influences, such as measurement errors, that would be caused by such analog elements. Further, the inventive method can significantly reduce the necessary calibrating time even in a case where the calibration is performed on a great number of D/A converters employed in an IC tester or the like.

The present invention may be implemented not only as a method invention as set forth above but also as an apparatus invention. The present invention may also be practiced as a program for execution by a processor such as a CPU or DSP, as well as a storage medium storing such a program.

BRIEF DESCRIPTION OF THE DRAWINGS

For better understanding of the object and other features of the present invention, its preferred embodiments will be described in greater detail hereinbelow with reference to the accompanying drawings, in which:

FIG. 1 is a block diagram showing an exemplary setup and behavior of a digital calibration apparatus in accordance with a preferred embodiment of the present invention which performs digital calibration on an A/D converter;

FIG. 2 is a graph explanatory of the digital calibration of the present invention, which shows examples of ideal and actual conversion characteristics of an A/D converter to be calibrated;

FIG. 4 is a block diagram showing an exemplary setup and behavior of a digital calibration apparatus of the present invention which performs digital calibration on a D/A converter.

DETAILED DESCRIPTION OF THE PREFERRED EMBODIMENTS

Figure 3:
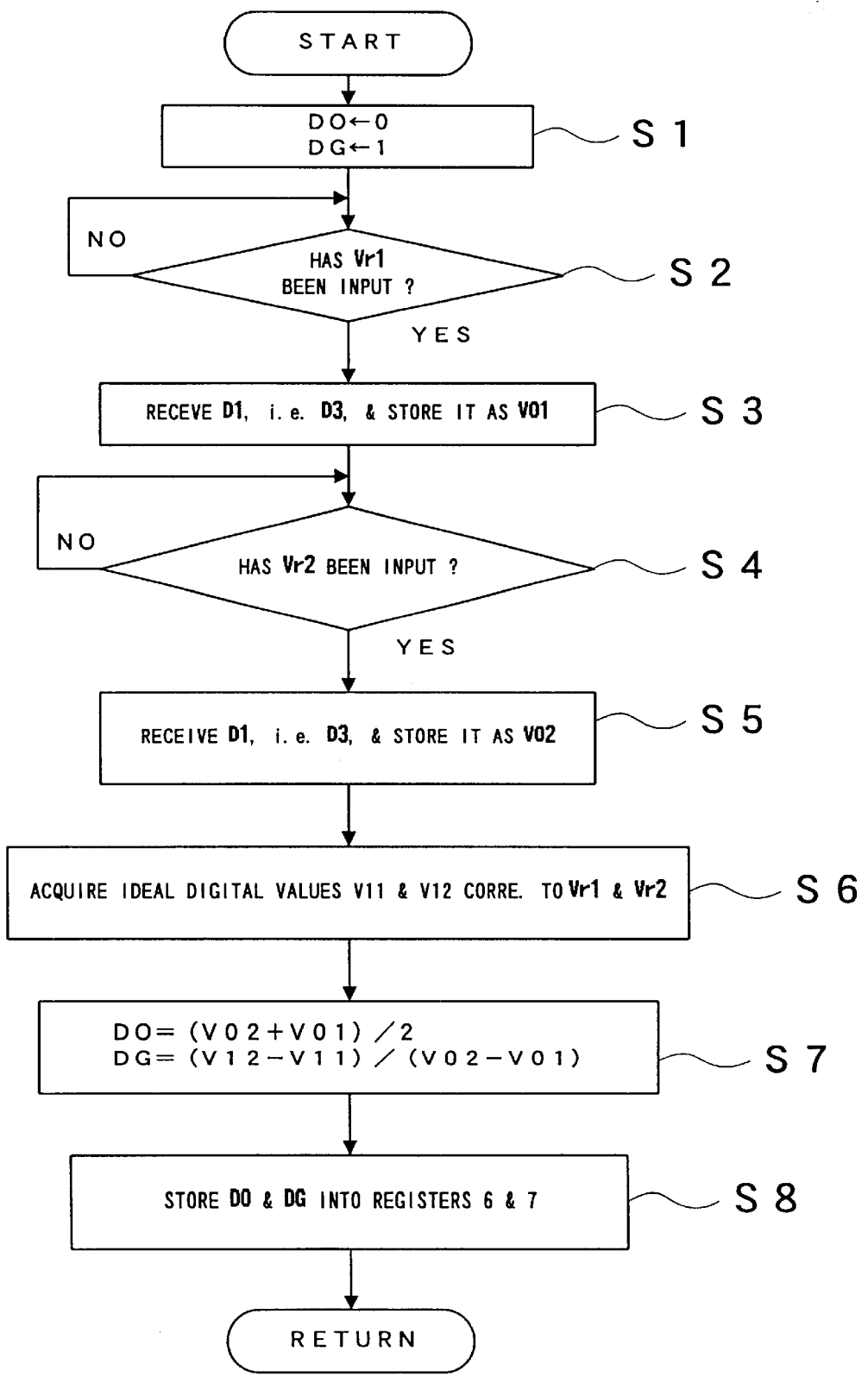
FIG. 3 is a flow chart showing an example of a calibrating program executed by a CPU of FIG. 1.

FIG. 1 is a block diagram showing an exemplary setup and behavior of a digital calibration apparatus in accordance with a preferred embodiment of the present invention which performs digital calibration on an A/D converter (ADC) 1. In the illustrated example of FIG. 1, the A/D converter 1 receives an analog signal and converts it into digital representation to thereby output digital signal D1 corresponding to the analog signal. Adder 2 adds together the digital signal D1 from the A/D converter 1 and offset calibration value DO given from an offset register 6 and supplies a multiplier 3 with digital signal D2 that is indicative of the added result. The multiplier 3 multiplies the digital signal D2 from the adder 2 by gain calibration coefficient DG given from a gain register 7 and outputs, to a tester bus (T-BUS) 5, digital signal D3 that is indicative of the multiplication result. The digital signal D3 thus output to the tester bus 5 is then delivered to a predetermined arithmetic operator section for necessary arithmetic processing.

The following paragraphs describe how the above-mentioned offset calibration value DO and gain calibration coefficient DG are calculated in the preferred embodiment, with reference to FIG. 2. Specifically, FIG. 2 shows an ideal conversion characteristic L0 and actual conversion characteristic L1 of the A/D converter. Namely, it is assumed here that the A/D converter 1 of FIG. 1 actually indicates the conversion characteristic L1 deviating from the ideal conversion characteristic L0 as shown here in FIG. 2. Thus, in the preferred embodiment, offset calibration value DO and gain calibration coefficient DG are calculated on the basis of the ideal conversion characteristic L0 and actual conversion characteristic L1, and the digital converted signal D1 output from the A/D converter 1 is converted into digital signal D3 conforming to the ideal conversion characteristic L0 shown in FIG. 2.

For example, according to the ideal conversion characteristic L0 of FIG. 2, a digital signal of predetermined value V12 ("7FFF" in the hexadecimal notation) is supposed to be output from the A/D converter in response to input of a positive full-scale analog signal voltage 10V, and a digital signal of predetermined value V11 ("8000" in the hexadecimal notation) is supposed to be output from the A/D converter in response to input of a negative full-scale analog signal voltage −10V. However, let's assume here that the actual A/D converter 1 outputs the digital signal D1 of digital value V02, different from the above-mentioned ideal value V12, in response to input of the analog signal voltage of 10V and outputs the digital signal D1 of digital value V01, also different from the above-mentioned ideal value V11 in response to input of the analog signal voltage of −10V.

Thus, in the illustrated example of FIG. 1, a CPU 4 first stores offset calibration value DO (="0") and gain calibration coefficient DG (="1") into the offset register 6 and gain register 7, respectively. Then, the CPU 4 inputs a predetermined first reference analog signal, e.g. positive full-scale analog signal voltage 10V, to the A/D converter 1 and then receives digital converted signal D1 that is output from the A/D converter 1 in response to input of the first reference analog signal, namely, digital signal D3 (=V02) output from the multiplier 3. Next, the CPU 4 inputs a predetermined second reference analog signal, e.g. negative full-scale analog signal voltage 10V, to the A/D converter 1 and then receives digital converted signal D1 output from the A/D converter 1 in response to input of the second reference analog signal, namely, digital signal D3 (=V01) that is output from the multiplier 3. Upon receipt of the digital signals D3 (=V02 and V01) corresponding to the positive and negative full-scale analog signals, the CPU 4 calculates offset calibration value DO and gain calibration coefficient DG using the following equations:

$$DO=(V02+V01)/2$$

$$DG=(V12-V11)/(V02-V01)$$

The thus-calculated offset calibration value DO and gain calibration coefficient DG are then stored into the offset register 6 and gain register 7, respectively. From that time on, the output signals DO and DG stored in the registers 6 and 7 will be fed to the adder 2 and multiplier 3 as calibration parameters.

In this way, each digital signal D1 subsequently output from the A/D converter 1 is adjusted or calibrated in accordance with the calibration parameters DO and DG via the adder 2 and multiplier 3, so as to present the ideal A/D conversion characteristic L0 as shown in FIG. 2. Thus, according to the preferred embodiment of the present invention, the necessary calibration can be performed automatically by the CPU 4 in a digital fashion, so that it is possible to eliminate a need for human labor. Further, because no analog components or elements are employed for the calibration, the preferred embodiment can avoid degradation of the calibrating accuracy that would result from various drifts and limitations to accuracy of the analog elements (appearing as an offset, resistance error, etc.). Furthermore, because the calibration can be performed with increased accuracy at increased speed as compared to the conventional binary search or least square method, the preferred embodiment can significantly reduce the necessary calibrating ti me even in a case where the calibration is performed on a great number of A/D converters employed in an IC tester or the like. In such a case, the above-mentioned registers 6 and 7 store the calibration parameters DO and DG for each of the A/D converters, and the same CPU 4 can be shared among the A/D converters.

For reference purposes, FIG. 3 shows a n example of a calibrating program that is executed by the CPU 4 of FIG. 1 to carry out the above-mentioned arithmetic operations. At first step S1, the calibration parameters DO and DG are set to values "0" and "1", respectively, and then stored into the respective registers 6 and 7. At next step S2, it is ascertained whether or not first reference analog signal Vr1 has been input to the A/D converter 1. Note t hat the input of the first reference analog signal Vr1 may be performed either manually or automatically under the control of the CPU 4. For the automatic input, it is only necessary that an instruction for generating the reference analog signal Vr1 be given at this step S2 so that an analog voltage generator or reference D/A converter (not shown) is caused to generate the reference analog signal Vr1. For the manual input, on the other hand, an analog voltage generator or reference D/A converter (not shown) generates the reference analog signal Vr1 to be input to the A/D converter 1, then input confirmation information is given to the CPU 4 via user's activation of a predetermined switch or otherwise, and this step S2 checks whether or not the input confirmation information has been actually given to the CPU 4. When it is ascertained at step S2 that the reference analog signal Vr1 has been input to the A/D converter 1, the program proceeds to step S3, where digital converted signal D1 generated by the A/D converter 1 converting the reference analog signal Vr1, i.e. digital signal D3 processed through the adder 2 and multiplier 3, is supplied to the CPU 4 and stored as digital value V01. In this case, a condition of "D1=D2=D3" has been established because the offset calibration value DO is currently set at "0" and the gain calibration coefficient DG is currently set at "1". In the above-described example, the first reference analog signal Vr1 has a voltage value of −10V, and digital converted signal V01 corresponding to the first reference analog signal Vr1 can not take a correct or ideal digital value of 31 10V as shown in FIG. 2 as long as the A/D converter 1 has a conversion error.

Then, at step S4, it is ascertained whether or not second reference analog signal Vr2 has been input to the A/D converter 1. Similarly to the above-mentioned first reference analog signal Vr1, the input of the second reference analog signal Vr2 may be performed either manually or automatically under the control of the CPU 4. At next step S5, digital converted signal D1 generated by the A/D converter 1 converting the second reference analog signal Vr2, i.e. digital signal D3 processed through the adder 2 and multiplier 3, is supplied to the CPU 4 and stored as digital value V02. At following step S6, ideal digital values V11 and V12 corresponding to the first and second reference analog signals Vr1 and Vr2 are acquired. These ideal digital values V11 and V12 are determined automatically depending on the specific values of the first and second reference analog signals Vr1 and Vr2. Then, at step S7, the same arithmetic operations as noted earlier are performed, on the basis of the stored digital values V01 and V02 and ideal digital values V11 and V12, to calculate offset calibration value DO and gain calibration coefficient DG. At next step S8, the offset calibration value DO and gain calibration coefficient DG thus calculated at step S7 are stored into the respective registers 6 and 7. Once these calibration parameters have been determined in the above-mentioned manner, the offset calibration value DO and gain calibration coefficient DG stored in the registers 6 and 7 are used in the adder 2 and multiplier 3, respectively, so that each digital signal output subsequently from the A/D converter 1 is adjusted in accordance with the calibration parameters.

FIG. 4 is a block diagram showing an exemplary setup and behavior of a digital calibration apparatus of the present invention which performs digital adjustment or calibration on a D/A converter (DAC) 11. In the illustrated example of FIG. 4, the D/A converter 11 receives a digital signal and converts it into analog representation to thereby output analog signal An. Adder 12 adds together digital signal D5 supplied from a CPU 4 by way of a tester bus 15 and offset calibration value Do given from an offset register 16 and then supplies a multiplier 13 with digital signal D6 that is indicative of the added result. The multiplier 13 multiplies the digital signal D6 from the adder 12 by gain calibration coefficient Dg from a gain register 17 and supplies the D/A converter 11 with digital signal D7 that is indicative of the multiplication result. The analog signal An output from the D/A converter 11 may be supplied to a predetermined IC to be tested or the like.

The analog signal An output from the D/A converter 11 is delivered to an A/D converter 18 for conversion into digital signal D8, and the digital converted signal D8 is fed back to the CPU 4. This is for the purpose of calculating the offset calibration value Do and gain calibration coefficient Dg to be used for the D/A converter 11. The same algorithm as set forth above in relation to the A/D converter 1 of FIG. 1 can be used to calculate the offset calibration value Do and gain calibration coefficient Dg. First, the CPU 4 stores offset calibration value Do of "0" and gain calibration coefficient Dg of value "1" into the offset register 16 and gain register 17, respectively. Then, a positive full-scale digital signal voltage is given to the adder 12 as a first reference signal, and digital converted value D8+obtained by converting the analog signal An from the D/A converter 11 is passed to the CPU 4. Then, a negative full-scale digital signal voltage is given to the adder 12 as a second reference signal, and digital converted value D8-obtained by converting the analog signal An from the D/A converter 11 is passed to the CPU 4. Upon receipt of the digital values D8+ and D8− corresponding to the positive and negative full-scale voltages, the CPU calculates offset calibration value Do and gain calibration coefficient Dg and stores them into the offset register 16 and gain register 17, respectively. In this way, the D/A converter 11 will then output analog signal An conforming to the ideal D/A conversion characteristic.

Figure 5:
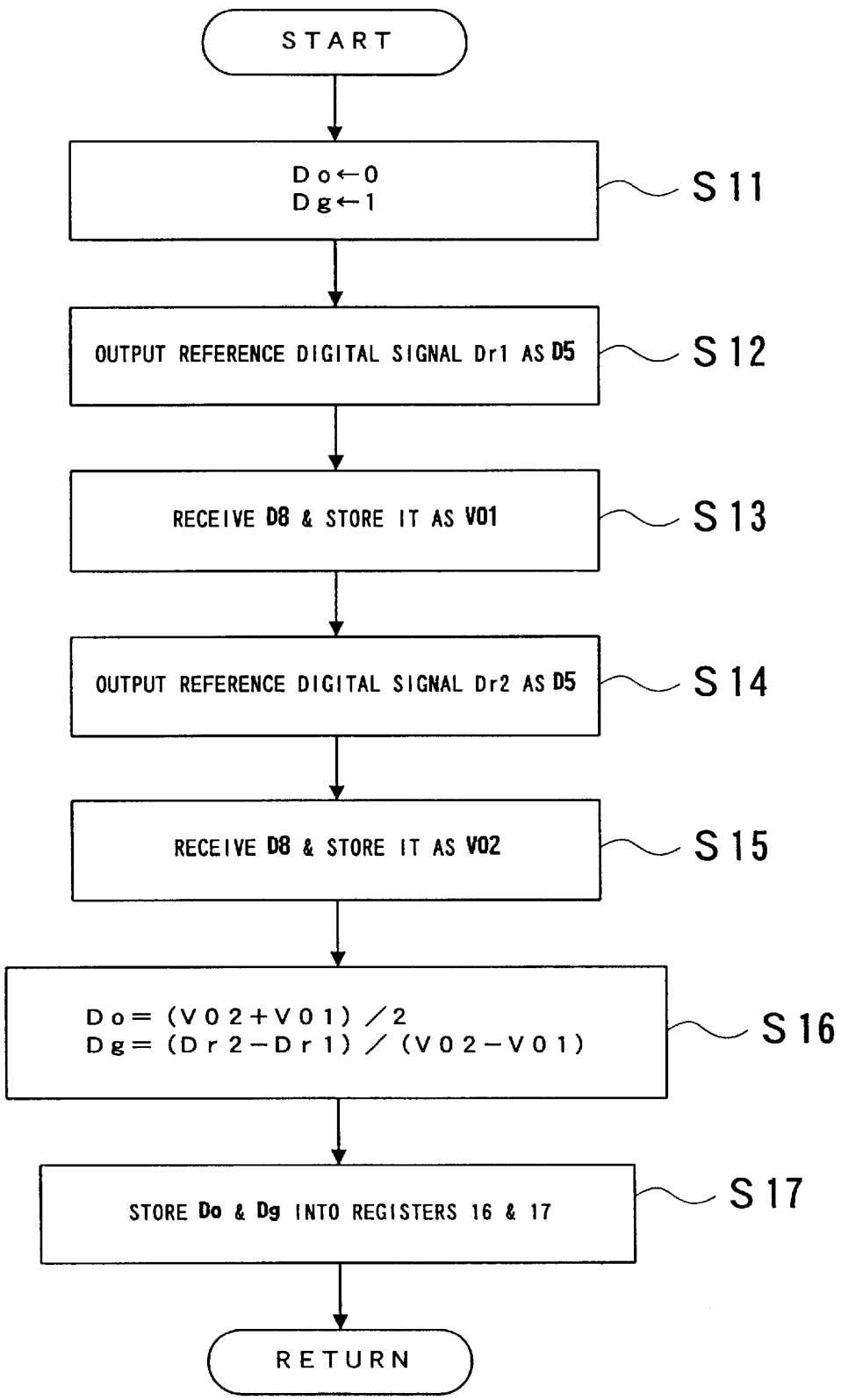
FIG. 5 is a flow chart showing an example of a calibrating program executed by a CPU 4 of FIG. 4.

For reference purposes, FIG. 5 shows an example of a calibrating program that is executed by the CPU 4 of FIG. 4 to carry out the above-mentioned arithmetic operations. At first step S11, the calibration parameters DO and DG are set to values "0" and "1", respectively, and then stored into the respective registers 16 and 17. At next step S12, first reference digital signal Dr1 is output as signal D5 via the bus (T-BUS) 15. This first reference digital signal Dr1 corresponds to, for example, the negative full-scale value. Because Do=0 and Dg=1, the digital signal D5 (=Dr1) from the bus 15 is input to the D/A converter 11 as it is (i.e. without being changed). Analog converted signal output from the D/A converter 11 in response to the input of the first reference digital signal Dr1 is further converted by the A/D converter 18 into digital signal D8, which is passed to the CPU 14. The CPU 14 receives the digital signal D8 and stores it as first reference converted value V01. At following step S14, second reference digital signal Dr2 is output as signal D5 via the bus (T-BUS) 15. This second reference digital signal Dr2 corresponds to, for example, the positive full-scale value. Analog converted signal output from the D/A converter 11 in response to the input of the second reference digital signal Dr2 is further converted by the A/D converter 18 into digital signal D8, which is passed to the CPU 14. The CPU 14 receives the digital signal D8 and stores it as second reference converted value V02, at step S15.

At next step S16, the CPU 4 calculates offset calibration value Do and gain calibration coefficient Dg on the basis of the thus-stored reference converted values V01 and V02 and reference digital signals Dr1 and Dr2, using the following equations that are generally similar to the ones set forth above in relation to the program of FIG. 3:

$$Do=(V02+V01)/2$$

$$Dg=(Dr2-Dr1)/(V2-V01)$$

The thus-calculated offset calibration value Do and gain calibration coefficient Dg are stored into the offset register 16 and gain register 17, respectively, at step S17. Once these calibration parameters have been determined in the above-mentioned manner, the offset calibration value Do and gain calibration coefficient Dg stored in the registers 16 and 17 are used in the adder 12 and multiplier 13, respectively, so that each digital signal subsequently input to the D/A converter 11 is adjusted in accordance with the calibration parameters.

Whereas the preferred embodiments of the present invention have been described above in relation to the case where positive and negative full-scale reference signals are fed to the A/D and D/A converters in order to calculate calibration parameters, the present invention is not so limited, and voltages near such positive and negative full-scale reference signals or any other suitable voltages may of course be fed to the A/D and D/A converters for calculation of the calibration parameters. Further, although the positive and negative full-scale voltages have been described as being of a same absolute value "in a symmetrical relation to each other about the zero value"), they may of course be of different absolute values "non-"symmetrical"); in such a case, it is only necessary that the two full-scale voltages be subjected to arithmetic operations so as to have a same absolute value and the offset calibration value be calculated using the results of such arithmetic operations.

In summary, the digital calibration technique of the present invention affords the superior benefit that it can perform digital calibrate on a great number of A/D and D/A converters with increased accuracy at increased speed.

What is claimed is:

1. A digital calibration method for an analog-to-digital converter comprising the steps of:

inputting at least first and second reference analog signals to an analog-to-digital converter to be calibrated, said first reference analog signal representing a predetermined positive value, said second reference analog signal representing a predetermined negative value;

calculating calibration parameters on the basis of digital converted signals outputted by said analog-to-digital converter in response to input of corresponding ones of the reference analog signals thereto, said step of calculating including a step of calculating, as one of the calibration parameters, an offset calibration value on the basis of addition between the digital converted signals corresponding to said first and second reference analog signals and a step of calculating, as another one of the calibration parameters, a gain calibration coefficient on the basis of subtraction between the digital converted signals corresponding to said first and second reference analog signals; and performing calibrating arithmetic operations on an output digital signal from said analog-to-digital converter, using the calibration parameters calculated by said step of calculating.

2. A digital calibration apparatus for an analog-to-digital converter comprising:

a processor coupled with an analog-to-digital converter to be calibrated, wherein when at least first and second reference analog signals are inputted to said analog-to-digital converter, said first reference analog signal representing a predetermined positive value, said second reference analog signal representing a predetermined negative value, and said processor acquires digital converted signals outputted by said analog-to-digital converter in response to input of corresponding ones of the reference analog signals thereto and then performs predetermined calculations to calculate calibration parameters on the basis of the digital converted signals outputted by said analog-to-digital converter, said predetermined calculations including a calculation for calculating, as one of the calibration parameters, an offset calibration value on the basis of addition between the digital converted signals corresponding to said first and second reference analog signals and a calculation for calculating, as another one of the calibration parameters, a gain calibration coefficient on the basis of subtraction between the digital converted signals corresponding to said first and second reference analog signals;

a storage that stores the calibration parameters calculated via said processor; and a digital arithmetic operator coupled to an output of said analog-to-digital converter for performing calibrating arithmetic operations on an output digital signal by use of the calibration parameters stored in said storage, said digital arithmetic operator including an adder for addition of the offset calibration value and a multiplier for multiplication of the gain calibration coefficient.

3. A digital calibration apparatus as claimed in claim 2 wherein a plurality of analog-to-digital converters are to be calibrated by said digital calibration apparatus, and wherein said processor calculates the calibration parameters for each of said analog-to-digital converters and said storage stores the calibration parameters calculated for each of said analog-to-digital converters.

4. A machine-readable storage medium containing a group of instructions for causing said machine to carry out a digital calibration method for an analog-to-digital converter, said method comprising the steps of:

inputting at least first and second reference analog signals to an analog-to-digital converter to be calibrated, said first reference analog signal representing a predetermined positive value, said second reference analog signal representing a predetermined negative value;

calculating calibration parameters on the basis of digital converted signals outputted by said analog-to-digital converter in response to input of corresponding ones of the reference analog signals thereto, said step of calculating including a step of calculating, as one of the calibration parameters, an offset calibration value on the basis of addition between the digital converted signals corresponding to said first and second reference analog signals and a step of calculating, as another one of the calibration parameters, a gain calibration coefficient on the basis of subtraction between the digital converted signals corresponding to said first and second reference analog signals; and storing the calibration parameters calculated by said step of calculating, the calibration parameters stored by said step of storing being used for calibrating an output digital signal from said analog-to-digital converter.

5. A digital calibration method for a digital-to-analog converter comprising the steps of:

inputting at least first and second reference digital signals to a digital-to-analog converter to be calibrated, said first reference digital signal representing a predetermined positive value, said second reference digital signal representing a predetermined negative value;

calculating calibration parameters on the basis of analog converted signals outputted by said digital-to-analog converter in response to input of corresponding ones of the reference digital signals thereto, said step of calculating including a step of calculating, as one of the calibration parameters, an offset calibration value on the basis of addition between the analog converted signals corresponding to said first and second reference digital signals and a step of calculating, as another one of the calibration parameters, a gain calibration coefficient on the basis of subtraction between the analog converted signals corresponding to said first and second reference digital signals; and performing calibrating arithmetic operations on the basis of an input digital signal to said digital-to-analog converter, using the calibration parameters calculated by said step of calculating.

6. A digital calibration method as claimed in claim 5 wherein said step of calculating includes a step of converting, into a digital signal, each of the analog converted signals outputted by said digital-to-analog converter in response to input of the corresponding reference digital signal and a step of calculating the calibration parameters on the basis of each of the digital signals provided by said step of converting.

7. A digital calibration apparatus for a digital-to-analog converter comprising:

a processor coupled with a digital-to-analog converter to be calibrated, said processor inputting at least first and second reference digital signals to said digital-to-analog converter, said first reference digital signal representing a predetermined positive value, said second reference digital signal representing a predetermined negative value, said processor performing predetermined calculations to calculate calibration parameters on the basis of analog converted signals outputted by said digital-to-analog converter in response to input of corresponding ones of the reference digital signals thereto, said predetermined calculations including a calculation for calculating, as one of the calibration parameters, an offset calibration value on the basis of addition between the analog converted signals corresponding to said first and second reference digital signals and a calculation for calculating, as another one of the calibration parameters, a gain calibration coefficient on the basis of subtraction between the analog converted signals corresponding to said first and second reference digital signals;

a storage that stores the calibration parameters calculated via said processor; and a digital arithmetic operator coupled to an input of said digital-to-analog converter for performing calibrating arithmetic operations on an input digital signal to said digital-to-analog converter by use of the calibration parameters stored in said storage, said digital arithmetic operator including an adder for addition of the offset calibration and a multiplier for multiplication of the gain calibration coefficient.

8. A digital calibration apparatus as claimed in claim 7 which further comprises an analog-to-digital converter coupled with said digital-to-analog converter and said processor and wherein said analog-to-digital converter converts, into a digital signal, each of the analog converted signals outputted by said digital-to-analog converter in response to input of the corresponding reference digital signal, and wherein said processor calculates the calibration parameters on the basis of each of the digital signals outputted by said analog-to-digital converter.

9. A digital calibration apparatus as claimed in claim 7 wherein a plurality of digital-to-analog converters are to be calibrated by said digital calibration apparatus, and wherein said processor calculates the calibration parameters for each of said digital-to-analog converters and said storage stores the calibration parameters calculated for each of said digital-to-analog converters.

10. A machine-readable storage medium containing a group of instructions for causing said machine to carry out a digital calibration method for a digital-to-analog converter, said method comprising the steps of:

inputting at least first and second reference digital signals to a digital-to-analog converter to be calibrated, said first reference digital signal representing a predetermined positive value, said second reference digital signal representing a predetermined negative value;

calculating calibration parameters on the basis of analog converted signals outputted by said digital-to-analog converter in response to input of corresponding ones of the reference digital signals thereto, said step of calculating including a step of calculating, as one of the calibration parameters, an offset calibration value on the basis of addition between the analog converted signals corresponding to said first and second reference digital signals and a step of calculating, as another one of the calibration parameters, a gain calibration coefficient on the basis of subtraction between the analog converted signals corresponding to said first and second reference digital signals; and performing calibrating arithmetic operations on the basis of an input digital signal to said digital-to-analog converter, using the calibration parameters calculated by said step of calculating.

11. A machine-readable storage medium as claimed in claim 10 wherein said step of calculating includes a step of converting, into a digital signal, each of the analog converted signals outputted by said digital-to-analog converter in response to input of the corresponding reference digital signal and a step of calculating the calibration parameters on the basis of each of the digital signals provided by said step of converting.

* * * * *